Nov. 30, 1965 J. S. CUBERT ETAL 3,221,185

PULSE FORMING AND SHAPING CIRCUIT EMPLOYING A CHARGE-STORAGE DIODE

Filed March 19, 1963 2 Sheets-Sheet 1

INVENTORS
JAMES J. MURPHY
JACK S. CUBERT

BY J. Donald Weber Jr.
AGENT

United States Patent Office 3,221,185

Patented Nov. 30, 1965

3,221,185

PULSE FORMING AND SHAPING CIRCUIT EMPLOYING A CHARGE-STORAGE DIODE

Jack S. Cubert, Willow Grove, and James J. Murphy, Philadelphia, Pa., assignors to Sperry Rand Corporation, New York, N.Y., a corporation of Delaware Filed Mar. 19, 1963, Ser. No. 266,336

10 Claims. (Cl. 307—88.5)

This invention relates to a circuit for producing output signals which have a substantially rectangular shape. In particular, the circuit is utilized to provide a high-power, substantially rectangular pulse with fast rise times.

Many types of pulse forming or pulse shaping circuits are known in the art. Many of these circuits are extremely specialized in the usage thereof or in the function performed thereby. Many of these circuits cannot provide efficient pulse production at specified frequencies and powers. The subject circuit is designed to provide an efficient pulse producing circuit which adapts storage diodes or snap diodes to relatively low frequencies, for example on the order of less than 50 megacycles per second. The circuit operates on the principle that a snap diode or storage diode will periodically provide a switching action in the sinusoidal input signal applied thereto. This switched sine wave is applied to other wave shaping networks and finally to a transistor. The transistor provides the final wave shaping function in accordance with the amplification factor thereof.

It will be seen that one object of this invention is to provide an efficient pulse producing network.

It is another object of this invention to provide a circuit which produces high-power, substantially rectangular output pulses with fast rise times.

Another object of this invention is to provide a pulse generator circuit which extends the frequency range of pulse generator circuits utilizing storage diodes.

Another object of this invention is to provide a pulse generator circuit which incorporates an effective means for coupling pulses to non-linear loads.

Another object of this invention is to provide a pulse generator circuit which adapts the high speed switching of storage diodes to the production of relatively low frequency output pulses.

Another object of this invention is to provide a circuit which permits easy pulse distribution to large systems whereby phase distortion problems are reduced.

Another object of this invention is to provide a pulse forming network which permits clocking signals and the like to be produced in response to a sine way, the transmission of which is relatively easy.

Another object of this invention is to provide a high-power pulse generator which has extremely small size.

These and other objects of this invention will become more readily apparent when read in conjunction with the attached drawings, in which.

Figure 1:
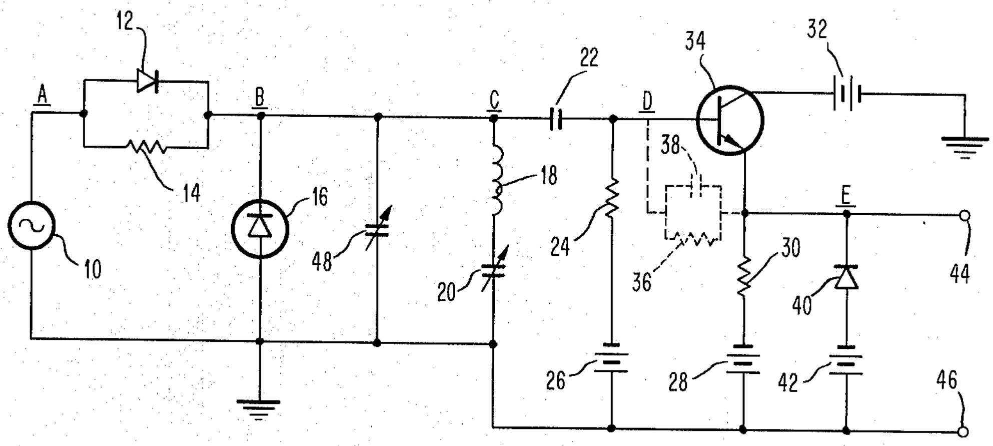
FIGURE 1 is a schematic diagram of the circuit which comprises the pulse generator which is the subject of this invention.

Referring now to FIGURE 1, there is shown a relatively detailed schematic diagram of a preferred embodiment of this invention. This circuit is designed to provide output pulses having a frequency which is less than about 50 megacycles per second. In addition, this circuit is designed to provide output power on the order of 1 watt. Of course, modifications in the components will provide somewhat modified operation of the circuit as may be desirable in specific instances.

The signal generator 10 may be any type of sine wave generator capable of supplying a signal having a frequency rate of approximately 25 megacycles per second. The signals may have a peak-to-peak value of approximately 20 to 25 volts. In the preferred embodiment, the sine wave is referenced to a middle point of approximately ground potential. This is suggested by connecting one terminal of the generator 10 to ground potential. Another terminal of generator 10 is connected to the parallel network comprising diode 12 and resistor 14. If necessary an impedance matching network, as for example a transformer or a coaxial cable or the like, may be included between the generator and the parallel network. Resistor 14 may have an impedance of approximately 18 ohms. Diode 12, which has the anode thereof connected to the terminal of signal generator 10, may be a Fairchild FD–176C. As will become more evident subsequently, the parallel network comprising resistor 14 and diode 12 functions as a current controlling or limiting network. Another terminal of resistor 14 and the cathode of diode 12 are each connected to the cathode of storage diode 16. Storage diode 16 which has the anode thereof connected to ground as well as to the first mentioned terminal of generator 10 may be a Rheem RD–750 type of diode. This high power storage diode is characterized by a capability of storing charge in the lattice structure thereof when a forward current passes therethrough and, furthermore, by long minority carrier lifetime. In addition, the application of a reverse current thereto after the storage of charge therein results in the passage of a reverse current therethrough until all of the charge stored therein is swept out of the lattice structure of the diode. Connected in parallel with the storage diode 16 is the LC tank circuit comprising inductor (L) 18 and variable capacitor (C) 20. Inductor 18 may be on the order of 65 nanohenries and capacitor 20 may have a range between about 10 and 35 picofarads. This tank circuit has the function of storing energy therein which energy is released in order to assist in shaping the signal produced at the cathode of diode 16 as well as adjusting the pulse width. Connected to the common junction of the inductor (or capacitor) and the cathode of storage diode 16 is one terminal of capacitor 22. Capacitor 22 which may have a value of approximately 68 picofarads has another terminal thereof connected to the base of transistor 34. Transistor 34 may be a Motorola type MM–487 transistor which has a high $f_t$ (400 mc.), where $f_t$ represents the gain-bandwidth product, as well as fast rise times at high current levels. Also connected to the base of transistor 34 is one terminal of bias resistor 24 which may be on the order of approximately 120 ohms and together with capacitor 22 forms an RC differentiating network. Another terminal of resistor 24 is connected to one terminal of source 26. Source 26 is any conventional source capable of supplying to the base of transistor 34 a biasing potential of approximately −3 volts with respect to ground and is shown as a battery. The collector of the NPN transistor 34 is connected to source 32. Source 32 may be any conventional type of source capable of supplying a substantially constant potential of approximately +5.8 volts with respect to ground and is represented by a battery. The emitter of the transistor 34 is connected to one terminal of resistor 30 which may be on the order of approximately 44 ohms. Another terminal of resistor 30 is connected to one terminal of source 28. Source 28 may be any conventional type of source capable of supplying a potential of approximately −9.5 volts with respect to ground and is represented by a battery. This bias network is designed to bias the emitter of transistor 34 to about −2.2 volts. Also connected to the emitter of transistor 34 is the output terminal 44 and the cathode of clamping diode 40. The anode of diode 40 which may be a Diatronics DGS–1010 diode is connected to one terminal of source 42. Diode 40 is a GaAs diode which is characterized by high conductance and fast recovery time and is utilized to miminize loading of the output pulse. Source 42 may be any conventional source capable of supplying a substantially constant potential of approximately −1.5 volts with respect to ground and is represented as a battery. Since diode 40 has a forward voltage drop of about 0.7 volt, the emitter of transistor 34 is clamped to a potential of about −2.2 volts. Terminal 46 is the ground terminal to which reference is made when detecting a signal at terminal 44.

In addition, the normal transition and stray capacitance and resistance between the base and emitter electrodes of resistor 34 are represented by the resistor 36 and the capacitor 38. The values of these components will vary with the type of transistor utilized and will also vary somewhat with the individual transistor. Therefore, specific values for these components cannot be defined.

Figure 2:
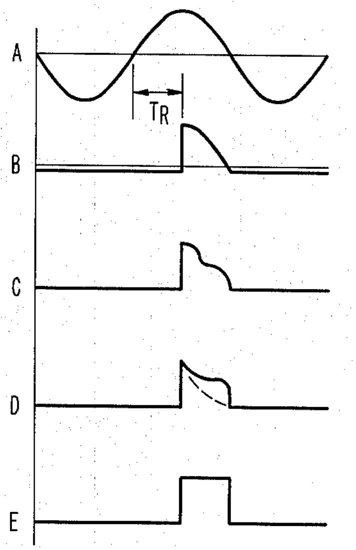
FIGURE 2 is an idealized showing of waveforms produced by the circuit.

In describing the operation of the circuit shown in FIGURE 1, concurrent reference is made to the waveforms shown in FIGURE 2. The waveforms of FIGURE 2 correspond to the points labeled A through E in FIGURE 1. The signal generator 10 produces a sinusoidal output signal as shown on line A of FIGURE 2. For convenience, it is assumed that the initial portion of the sine wave produced by signal 10 is a negative going signal. Thus, the potential at the cathode of storage diode 16 is negative relative to the anode thereof which is at ground potential as suggested on line B of FIGURE 2. Therefore, forward current conduction exists in storage diode 16. This current flows through resistor 14 to signal generator 10. In this condition diode 12 is reverse biased because the potential at the cathode thereof is higher relative to the potential at the anode thereof. The forward current through storage diode 16 causes the storage of charge in the lattice structure thereof. It should be noted that the forward impedance of the storage diode 16 is very small whereby the storage diode 16 appears as a substantial short circuit or shunt load across the generator 10 and the remainder of the circuit. As the signal generator 10 continues to produce the sine wave, the potential across diode 16 is gradually reduced and finally is reversed. That is, the potential at the anode of diode 12 becomes positive with respect to the potential at the cathode thereof such that forward current flows therethrough. The forward impedance of the diode 12 is a small impedance. The impedance of diode 12 when taken in parallel with the impedance of resistor 14 becomes a very small impedance on the order of only a few ohms. This impedance network provides a current limiting means in the circuit comprising the signal generator and the diode 16.

Because of the previous forward current through diode 16 charge was stored therein and a reverse current will now flow therein. This reverse current will flow in diode 16 until the charge stored therein has been swept out of the lattice structure of the diode. While the reverse current exists in diode 16 (represented by time period $T_R$), the impedance thereof is extremely small. Therefore, the diode 16 acts as a shunt across the circuit and the potential at the cathode thereof remains substantially constant. Finally, however, the charge which had been stored in diode 16 is fully removed therefrom. At this point, the diode 16 switches, ideally, to an open circuit and the shunt path across the circuit is effectively removed. The time at which this switching occurs is determined in part, by the amount of current flow through the diode 16 and the amount of charge injected during the negative charging cycle. Therefore the current regulating network comprising resistor 14 and diode 12 is of importance inasmuch as this network regulates the amount of current flow in diode 16. It is necessary that the stored charge be swept out of diode 16 prior to the termination of the positive portion of the sine wave. Moreover, it is normally required that the storage diode becomes an effective open circuit prior to the time when the sine wave input signal reaches its maximum or peak value. As shown on line B in FIGURE 2, the potential at the cathode of diode 16 suddenly switches from ground, or lower potential, to approximately +10 or +12 volts depending upon the value of the positive portion of the signal provided by the generator 10 at the switching time of diode 16. The signal produced then approximates a ¼ period cosine pulse with a fast rise time. With the sudden change in the potential at the cathode of diode 16, a sudden potential change exists across the tank circuit or reactive network comprising inductor 18 and capacitor 20. This sudden change across the tank circuit causes the tank circuit to store energy therein. It will be seen that as the potential at the cathode of diode 16 decreases along the sinusoidal wave shape, energy is released by the tank circuit and tends to maintain the potential at the cathode of the diode at the higher level as shown on line C in FIGURE 2. This phenomenon, of course, tends to make the wave shape at this point more nearly rectangular.

Because of the sudden switching of the storage diode 16 and the subsequent release of energy by the tank circuit, the wave shape at the cathode of diode 16 may not have a substantially flat top and may, in fact, have a top having several peaks. The pulse is fed into the differentiating circuit comprising capacitor 22 and resistance 24. This differentiating circuit, as is known, tends to produce a signal having a fast-rise time and a substantially sloped trailing edge as shown on line D of FIGURE 2. The amount of slope of the trailing edge of the pulse is determined by the values of the components making up the differentiating circuit. Different slopes are suggested by the dashed lines included in the signal shown on line D of FIGURE 2. The amount of slope in the pulse which is desirable, is dictated by the operating characteristics of the transistor 34, especially the amplification factor thereof.

Transistor 34 is normally biased in the OFF condition. That is, the base is normally biased to approximately −3 volts by the bias network comprising source 26 and resistor 24. In addition, the emitter of the transistor 34 is biased to approximately −2.2 volts by the bias network comprising resistor 30 and source 28. The clamping network comprising source 42 and diode 40 also assures that the emitter will not be made more negative. In order for the transistor 34 to be turned ON, the potential at the base thereof must be raised to a potential equal to −2.2 volts (the potential at the emitter thereof) plus the base to emitter voltage drop which may be on the order of 0.7 to 0.8 volt. Typically, a potential of about −2.0 volts at the base thereof may switch the transistor 34 to the ON state.

The signal produced by the differentiating network (line D, FIGURE 2) is applied to the base of the transistor 34. The leading edge of the pulse applied by the differentiating network has a very high rise time and a substantially high potential value. This portion of the pulse is passed through the transistor 34. However, inasmuch as the transistor 34 is initially turned ON by this signal, the transistor has little or no amplification. Thus, it may be considered that the leading edge of the pulse produced by the differentiator passes from the base to the emitter of the transistor 34 via the transition capacitance 38 and leakage resistance 36 between the base emitter. This is sometimes referred to as the transient response of the transistor. This signal portion is a substantially large portion and is passed to the emitter of the transistor with little or no amplification. Due to the transient response of the transistor, this large signal is produced at the output terminal 44.

As the transistor continues in the ON condition, the amplification factor thereof increases with time. Moreover, as was suggested supra, the output signal produced by the differentiating circuit has a slope or trailing edge which is decreasing in potential with time. Therefore, it may be seen that the interaction of the decreasing potential (and current) of the input signal at the base of the transistor and the increasing value of the amplification factor are interdependent. That is, as the amplification factor increases, it is desirable that the input signal decrease in order that a substantially constant level be maintained at the emitter of the transistor as shown on line E of FIGURE 2. Thus, it is clear that the differentiating circuit must be designed in accordance with the amplification factor of the transistor 34.

It has been found that in some cases, the speed of switching of the storage diode 16 is so fast that a large overshoot spike, or even ringing, occurs at the leading edge of the pulse produced at the cathode of diode 16. This spike (not shown) may be of such proportions as to cause a substantial transient current to flow through the transistor 34 to the loads connected at output terminal 44. In some cases, this large current is detrimental and is capable of destroying the transistor. In order to avoid this problem, a variable capacitor 48 may be connected in parallel with the diode 16. Typically, this capacitor may have a value of 3 to 11 picofarads. By varying the capacitance thereof, the effective capacitance of the diode 16 is varied and the rise time of the signal produced at the cathode of diode may be slowed down. By slowing down the rise time of the signal applied at the base of the transistor, the transient current in the load is limited. Capacitor 48 is necessary only in cases where the rise time is excessively fast for the desired utilization of the circuit. In other cases, the capacitor 48 may be omitted.

It should be understood also, that the bias network at the emitter of transistor 34 may be altered also. The network shown is that which is applied when the loads for the network are of a non-linear type. Furthermore, this system may be used if the number of loads applied to output terminal 44 is variable. However, if the load applied to the output terminal 44 and, thus to the emitter of transistor 34 is constant, the network comprising the clamping diode 40 and source 42 may be eliminated. This might require a modification of the potential source 28 or resistor 30 insofar as the magnitude of the potential supplied to the emitter of transistor 34 is concerned.

Figure 3:
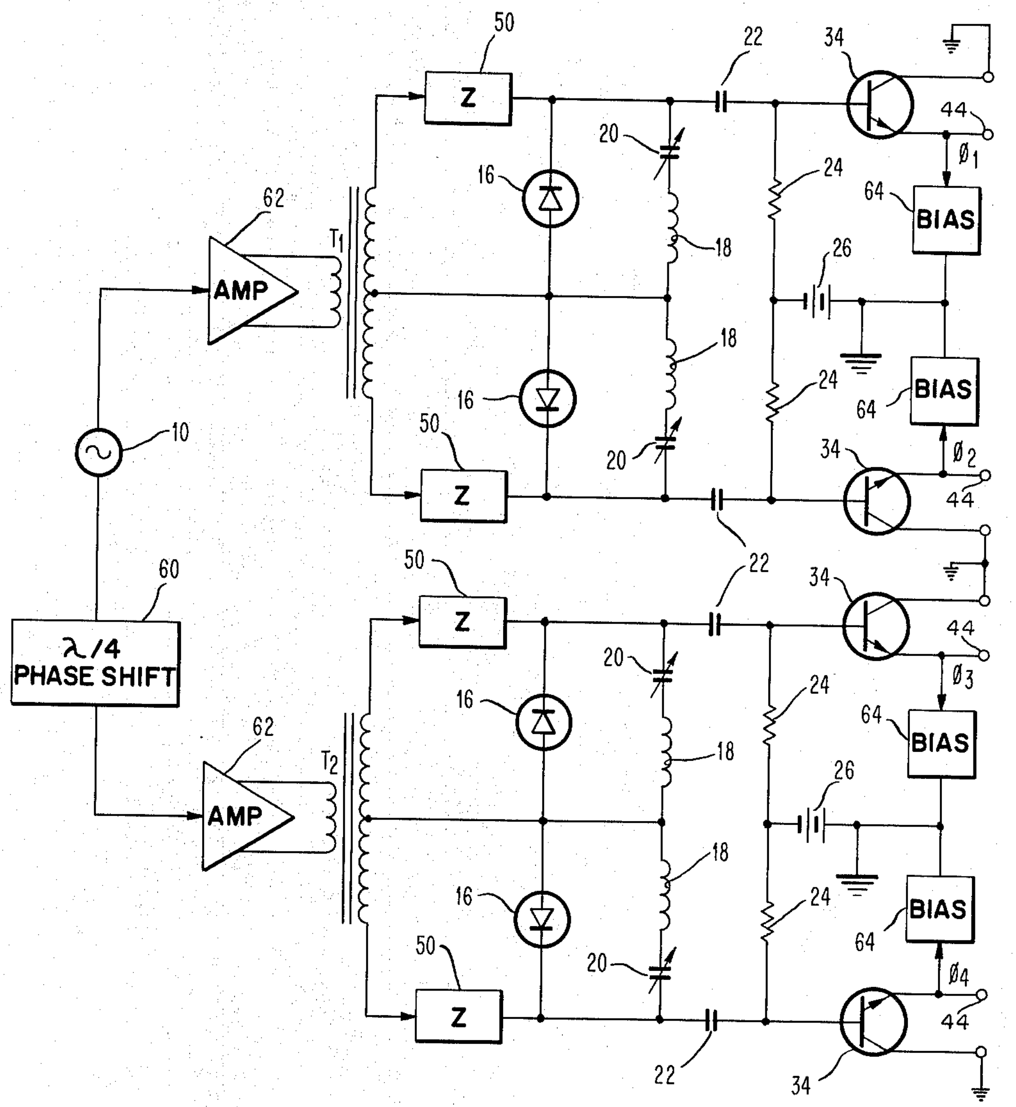
FIGURE 3 is a schematic diagram of a four-phase pulse generating system.

Referring now to FIGURE 3, there is shown a schematic diagram for a four-phase pulse generating system. This system comprises, essentially, four circuits similar to the basic circuit shown in FIGURE 1. These four circuits are connected to form two circuit-pairs. In FIGURE 3, components which are similar to components shown in FIGURE 1 bear similar reference numerals. Moreover, the operation of each of the basic circuits is identical to that previously described. In this system, the pulse generator 10 is connected to two power amplifiers 62. In the connecting link to one of the power amplifiers, there is a phase shifting network 60. This network has the capability of shifting the phase of the signal produced by generator 10 by the amount of $\lambda/4$. The power amplifiers are connected to the primary windings of transformers T1 and T2, respectively. Because of the phase shifting network 60, the signals supplied to the primary windings of transformers T1 and T2 are 90° out of phase. The secondary windings of transformers T1 and T2, respectively, receive input signals from the primary windings of the transformers. These signals are applied to the remainder of the circuit via the impedance network 50. The impedance network 50 actually comprises the resistor and diode parallel combination which is shown in FIGURE 1.

It will be seen that the center-tapped secondary windings of both of the transformers T1 and T2 apply signals, which are 180° out of phase, to each of the pair of storage diodes 16 associated therewith. Thus, when one of the storage diodes 16 in either of the circuit-pairs is conducting, the other storage diode 16 is reverse-biased. The operation of the circuits is similar to that noted supra such that the output signal produced at the output terminals 44 of a circuit-pair are 180° out of phase. That is, assuming the $\phi_1$ circuit to be the reference or zero degree phase, the output signal designated as $\phi_2$ is 180° out of phase therewith. Similarly, output signals $\phi_3$ and $\phi_4$ are 180° out of phase.

In addition, because of the insertion of the phase shifting network 60, a phase shift is exhibited between the output signals of the two circuit-pairs. Thus, since the phase shift produced by the network 60 is $\lambda/4$, the phase difference between the two circuit-pairs is 90°. In other words, the $\phi_3$ signal is 90° out of phase with the $\phi_1$ signal and the $\phi_4$ signal is 90° out of phase with the $\phi_2$ signal. (Of course, the $\phi_4$ signal is also −90° out of phase with the $\phi_1$ signal.)

A signal generating scheme such as that shown in FIGURE 3 is not absolutely necessary. In the event that only two phases of signals are required, which signals are to be 180° apart, only the upper (or lower) portion or circuit-pair of the system need be utilized. However, in order to show a complete system, the four phase scheme is illustrated. It is to be understood also, that by the insertion of differing phase shifting networks 60, differing phase differences between the different circuits may be obtained.

Other modifications may suggest themselves to those skilled in the art. For example, coupling capacitors on the order of 0.01 microfarad may be connected between the bias networks at the emitter and the base of the transistor as well as the collector of the transistor in order to provide low A.C. impedance throughout the circuit. However, these modifications do not substantially alter the operation of the circuit. These modifications may be incorporated if desired in specific applications of the circuit but normally may be omitted. The omission or inclusion of these modifications does not significantly alter the inventive concepts which are described in the claims pended hereto.

The embodiments of the invention in which an exclusive property or privilege is claimed are defined as follows:

1. In combination, a sinewave generator, current limiting means connected to said sinewave generator, said current limiting means including variable impedance means, non-linear impedance means connected in parallel with said sinewave generator and said current limiting means, said non-linear impedance means capable of providing high and low shunt impedance alternatively, energy storing means connected in parallel with said non-linear impedance means, differentiating network means connected to said energy storing means and to said non-linear impedance means, and transistor means connected to said differentiating network means, said transistor means exhibiting a varying amplification factor.

2. In combination, a signal generator providing different alternating signal levels, current limting means connected to said signal generator, said current limiting means exhibiting separate impedance values for the different signal levels, switching means exhibiting charge storage connected in parallel with said signal generator and said current limiting means, said switching means capable of alternatively providing high and low shunt impedance in accordance with the absence and presence of stored charge respectively, energy storing means connected in parallel with said switching means, differentiating network means connected to said energy storing means and to said switching means, NPN transistor means having base, collector and emitter electrodes, said transistor means exhibiting transient conduction having the base electrode thereof connected to said differentiating network means, separate bias means connected to each electrode of said transistor means, and output means connected to the emitter electrode of said transistor means.

3. A pulse generating circuit comprising, a signal generator for producing signals having at least two different levels, charge storage means connected in shunt with said signal generator, said charge storage means being capable of forward current conduction and charge storage in response to one level signal produced by said signal generator and limited reverse current conduction and charge recombination with ultimate nonconduction in response to a different level signal produced by said signal generator whereby a fast rise-time signal is produced thereacross, energy storing means connected in shunt with said charge storage means such that energy is stored therein during the leading edge of said fast rise-time signal and released thereafter in order to supplement the trailing edge of said signal, differentiating network means connected to said energy storing means to provide a predetermined negative slope at the trailing edge of the signal produced across said charge storing means, and transistor means connected to said differentiating network means, said transistor means characterized by fast transient conduction with little amplification and a varying amplification factor which is related to the negative slope of the trailing edge of the signal produced by said differentiating network such that a substantially flat-top signal is produced by said transistor means.

4. A pulse generating circuit comprising, a signal generator for producing signals having at least two different levels, diode means connected in shunt with said signal generator, said diode means being capable of forward current conduction and charge storage in response to one level signal produced by said signal generator and limited reverse current conduction and charge recombination with ultimate non-conduction in response to a different level signal produced by said signal generator where by a fast rise-time signal is produced thereacross, energy storing means connected in shunt with said diode means such that energy is stored therein during the leading edge of said fast rise-time signal and released thereafter in order to supplement the trailing edge of said signal, differentiating network means connected to said energy storing means to provide a predetermined negative slope at the trailing edge of the signal produced across said diode means, transistor means connected to said differentiating network means, said transistor means characterized by fast transition conduction with little amplification and a varying amplification factor which is the complement of the trailing edge of the signal produced by said differentiating network such that a substantially flat-top signal is produced by said transistor means, and bias means connected to said transistor means to control the operation thereof.

5. A pulse generating circuit comprising, a signal generator for producing a variable signal having at least two different potential magnitudes, snap diode means connected in shunt with said signal generator, said snap diode means being capable of forward current conduction and charge storage in response to one potential produced by said signal generator and limited reverse current conduction and charge recombination in response to a different potential produced by said signal generator, said snap diode means being characterized by rapid switching between the reverse current conduction mode to a nonconducting mode when the charge recombination is complete whereby a fast rise-time signal is produced thereacross, reactive network means connected in shunt with said snap diode means such that energy is stored in said reactive network during the leading edge of said fast rise-time signal and released thereafter in order to supplement the trailing edge of said signal, differentiating network means connected to said reactive network means to provide a predetermined negative slope at the trailing edge of the signal produced across said reactive network means, NPN transistor means connected to said differentiating network means, said transistor means characterized by fast transient conduction with little amplification and a varying amplification factor which is related to the negative slope of the trailing edge of the signal produced by said differentiating network such that a substantially flat-top signal is produced by said transistor means, bias means connected to said transistor means to control the operation thereof, and output means connected to said transistor means.

6. In a multiphase signal generating circuit, a plurality of pulse generating circuits as called for in claim 3, said circuits connected together in circuit-pairs such that signals which are 180° out-of-phase are produced by each of the circuits in a circuit-pair.

7. In a multiphase signal generating circuit, a plurality of pulse generating circuits as called for in claim 3, said circuits connected together in circuit-pairs such that signals which are 180° out-of-phase are produced by each of the circuits in a circuit-pair, and phase shifting means connected between different circuit-pairs to produce different phase relationships between different circuit-pairs.

8. The pulse generating circuit recited in claim 3, wherein said fast rise-time signal is produced across said charge storage means only when said reverse current conduction and said charge recombination terminate in said ultimate non-conduction.

9. The pulse generating circuit as recited in claim 8 wherein said charge storage means is capable of said reverse current conduction and said charge recombination only subsequent to a prior forward current conduction and charge storage therein.

10. In combination, an input signal generator for supplying signals having two distinct magnitudes, rectifier diode means connected to said input signal generator, linear resistance means connected in parallel with said rectifier diode such that different impedances are presented to the different magnitudes of input signals supplied, storage diode means connected in parallel with said input signal generator and said rectifier diode and said linear resistance, said storage diode storing charge therein in response to forward current therein produced by one input signal magnitude, said storage diode providing reverse current therethrough due to recombination of charge stored therein which combination is caused by another of said input signal magitudes, LC energy storing means connected in parallel with said storage diode to store energy when said storage diode terminates said recombination of stored charge, RC differentiating means connected to said LC energy storing means to differentiate the signal produced by said LC energy storing means in order to provide a sloping trailing edge of the signal produced, a transistor having base, emitter and collector electrodes, said RC differentiating means connected to said base electrode of said transistor for supplying thereto the signal produced with a sloping trailing edge, said transistor amplifying the trailing edge of the signal supplied to the base thereof more than the leading edge thereof to provide a substantially flat output signal at the emitter electrode thereof.

References Cited by the Examiner

UNITED STATES PATENTS

| | | | |
|---|---|---|---|
| 2,849,626 | 8/1958 | Klapp | 307—88.5 |
| 2,981,852 | 4/1961 | MacLean et al. | 307—88.5 |

ARTHUR GAUSS, *Primary Examiner.*